United States Patent
Kanari

(10) Patent No.: US 8,185,855 B2
(45) Date of Patent: May 22, 2012

(54) CAPACITOR-CELL, INTEGRATED CIRCUIT, AND DESIGNING AND MANUFACTURING METHODS

(75) Inventor: Katsunao Kanari, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 188 days.

(21) Appl. No.: 12/461,301

(22) Filed: Aug. 6, 2009

(65) Prior Publication Data

US 2009/0302422 A1    Dec. 10, 2009

Related U.S. Application Data

(63) Continuation of application No. PCT/JP2007/056968, filed on Mar. 29, 2007.

(51) Int. Cl.
*G06F 17/50*    (2006.01)
(52) U.S. Cl. .......................................... 716/110; 716/55
(58) Field of Classification Search .................. 716/110
See application file for complete search history.

(56) References Cited

U.S. PATENT DOCUMENTS

| | | | |
|---|---|---|---|
| 7,309,906 B1 * | 12/2007 | Tyhach et al. ................. | 257/532 |
| 2004/0015802 A1 * | 1/2004 | Cloudman et al. ............... | 716/8 |
| 2005/0017320 A1 * | 1/2005 | Itoh et al. ...................... | 257/532 |
| 2007/0170553 A1 * | 7/2007 | Correale et al. .............. | 257/665 |

FOREIGN PATENT DOCUMENTS

| | | |
|---|---|---|
| JP | 61-294834 | 12/1986 |
| JP | 4-111462 | 4/1992 |
| JP | 2002-313937 | 10/2002 |
| JP | 2004-335902 | 11/2004 |

OTHER PUBLICATIONS

International Search Report for PCT/JP2007/056968, mailed Apr. 24, 2007.

* cited by examiner

*Primary Examiner* — Paul Dinh
*Assistant Examiner* — Bryce Aisaka
(74) *Attorney, Agent, or Firm* — Fujitsu Patent Center

(57) ABSTRACT

A capacitor-cell is in an integrated circuit that is configured by disposing a plurality of cells on a site that is on a chip and that is provided between a power line and a grounding line in a direction of the power line and grounding line. The capacitor cell is disposed in a remaining region on the site, after the plurality of cells are disposed on the site. The capacitor-cell includes a gate poly for accumulating capacitance extending up to at least one of positions of the power line and the grounding line in a planar quadrangular cell-frame that is set for disposing the plurality of cells on the site.

5 Claims, 5 Drawing Sheets

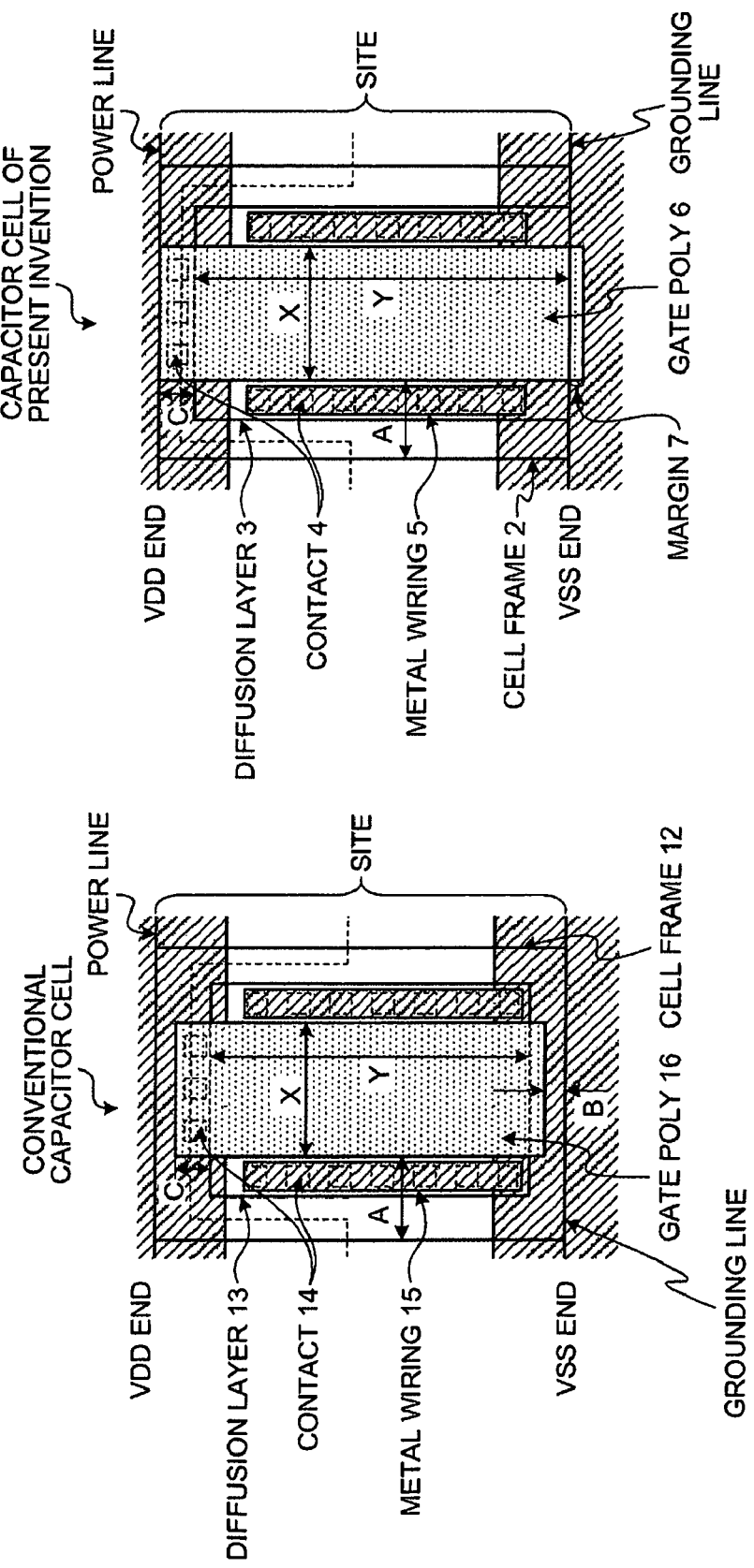

FIG.4

| TYPE | CAPACITY RATIO |
|---|---|
| CONVENTIONAL CAPACITOR CELL | 100% |
| CAPACITOR CELL ENLARGED TO POWER LINE END AND GROUNDING LINE END | 142% |
| CAPACITOR CELL ENLARGED TO ONLY POWER LINE END | 119% |
| CAPACITOR CELL ENLARGED TO ONLY GROUNDING LINE END | 127% |

CAPACITOR-CELL, INTEGRATED CIRCUIT, AND DESIGNING AND MANUFACTURING METHODS

CROSS-REFERENCE TO RELATED APPLICATION

This application is a continuation of PCT international application Ser. No. PCT/JP2007/056968 filed on Mar. 29, 2007 which designates the United States, incorporated herein by reference, the entire contents of which are incorporated herein by reference.

FIELD

The embodiments discussed herein are directed to a capacitor-cell, an integrated circuit configured by disposing the capacitor-cell, a designing method of the integrated circuit, and a manufacturing method of the integrated circuit.

BACKGROUND

Conventionally, various methods of designing integrated circuits configured by disposing a plurality of cells formed per processing function have been disclosed (for example, see Japanese Laid-open Patent Publication No. 2004-335902). When an integrated circuit is designed, to stabilize an operation of the integrated circuit, a capacitor-cell that is formed as a decoupling capacitor is generally disposed between integrated circuits configured of transistors.

In recent years, as the cell-size of integrated circuits due to miniaturization of semiconductor devices has decreased, the per-unit-area capacity of capacitor-cells has become smaller. Thus, it has become difficult to secure decoupling capacity by the capacitor-cells. Accordingly, various counter-measures have been taken to secure the decoupling capacity by the capacitor-cells.

However, the various counter-measures have problems of having to enlarge a chip size, prepare a large separate site, and use a transistor having a large leak current.

More specifically, there is a problem of having to enlarge the chip size to secure a space for disposing a capacitor-cell that is preferable to secure a decoupling capacity.

Further, there is a problem of having to prepare a separate site larger than an ordinary site in which functional parts (functional parts such as a circuit block and a memory in the integrated circuit) constituting the integrated circuit are disposed, for the purpose of disposing the capacitor-cell preferable for securing the decoupling capacity.

Moreover, there is a problem of having to configure the capacitor-cell using a transistor having a large leak current to secure the decoupling capacity, even though such a configuration is a cause of an increase in electric power consumption in the integrated circuit.

SUMMARY

According to an aspect of the invention, a capacitor-cell is in an integrated circuit that is configured by disposing a plurality of cells on a site that is on a chip and that is provided between a power line and a grounding line in a direction of the power line and grounding line. The capacitor cell is disposed in a remaining region on the site, after the plurality of cells are disposed on the site, and the capacitor-cell includes a gate poly for accumulating capacitance extending up to at least one of positions of the power line and the grounding line in a planar quadrangular cell-frame that is set for disposing the plurality of cells on the site.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2A is an enlarged schematic diagram of the conventional capacitor-cell;

FIG. 2B is an enlarged schematic diagram of the capacitor-cell according to the embodiment of the present invention;

FIG. 4 is a diagram of an example of capacity ratio between capacitance accumulated in a conventional capacitor-cell and capacitance of a capacitor-cell according to the embodiment of the present invention.

DESCRIPTION OF EMBODIMENTS

A capacitor-cell, an integrated circuit, an integrated circuit designing method, and an integrated circuit manufacturing method according to an example of the present embodiment (metal oxide semiconductor) is explained in detail with reference to the accompanying drawings. The capacitor-cell according to an example of the present embodiment is mainly explained below.

Embodiment

Figure 1A:
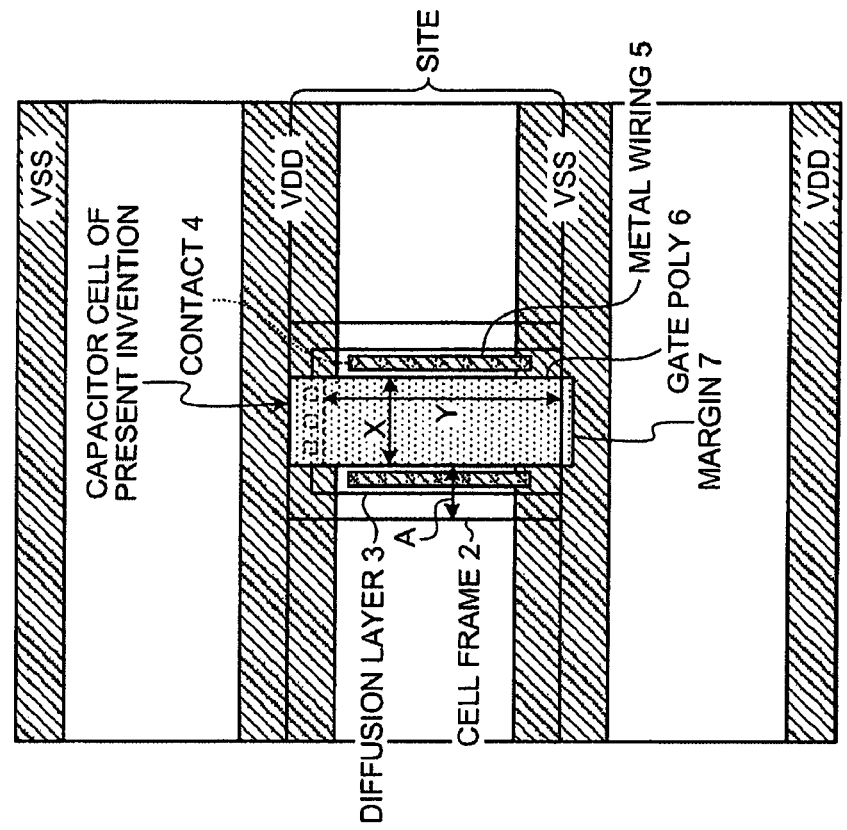
FIG. 1A is a schematic diagram of a conventional capacitor-cell.
Figure 3:
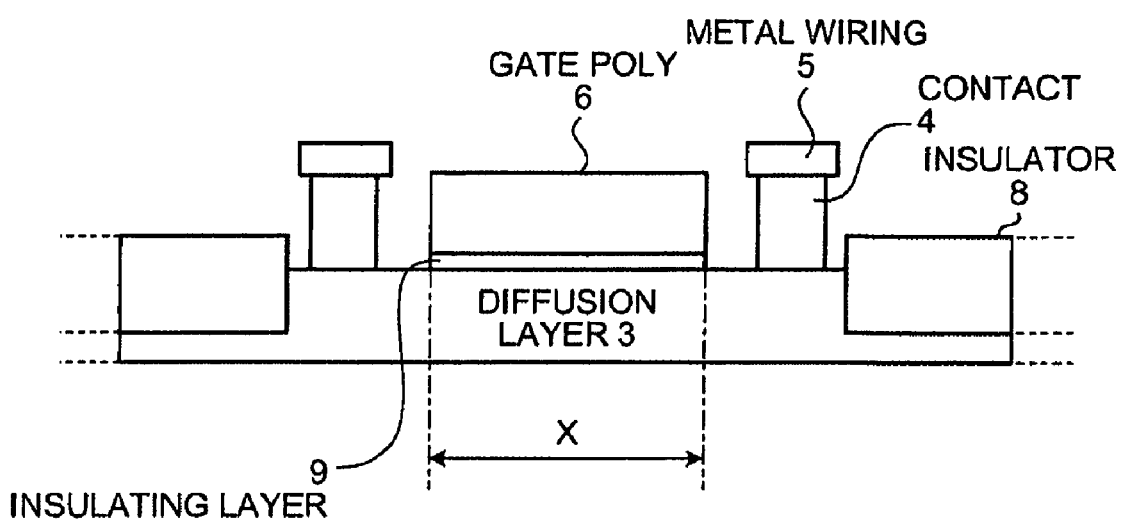
FIG. 3 is a cross section of the capacitor-cell according to the embodiment of the present invention.
Figure 5:
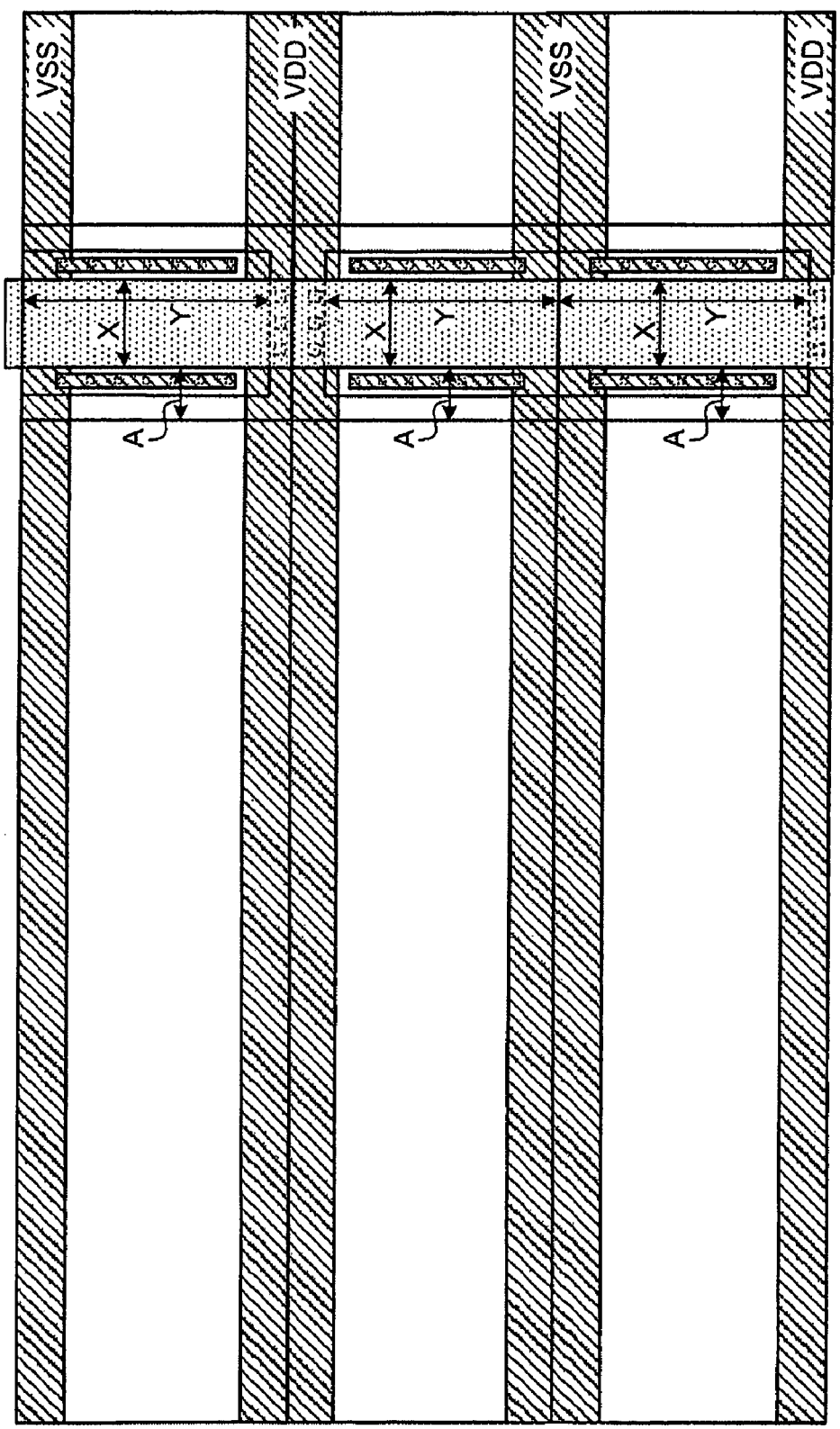
FIG. 5 is a diagram of a connection example in which a plurality of capacitor-cells according to the embodiment of the present invention are vertically connected.

With reference to FIG. 1A to FIG. 5, the capacitor-cell according to the example of the present embodiment is explained. FIG. 1A is a schematic diagram of a conventional capacitor-cell and FIG. 1B is a schematic diagram of the capacitor-cell according to the example of the present embodiment. FIG. 2A is an enlarged schematic diagram of the conventional capacitor-cell and FIG. 2B is an enlarged schematic diagram of the capacitor-cell according to the example of the present invention. FIG. 3 is a cross section of the capacitor-cell according to the example of the present embodiment. FIG. 4 is a diagram of an example of capacity ratio between capacitance accumulated in the conventional capacitor-cell and capacitance of the capacitor-cell according to the example of the present embodiment. FIG. 5 is a diagram of a connection example in which a plurality of capacitor-cells according to the example of the present embodiment are vertically connected.

The capacitor-cell according to the example of the present embodiment is each disposed in a remaining region on one or more sites after a plurality of cells (for example, functional parts including a circuit block and a memory) formed per processing function are disposed on the one or more sites in an integrated circuit configured by disposing the plurality of cells on the one or more sites. The one or more sites is/are a region on a chip that is/are disposed between a power line (VDD) and a grounding line (VSS) in a direction of the power line and grounding line. This capacitor-cell is characterized in that it is possible to increase a per-unit-area capacity of the capacitor-cell and secure a large decoupling capacity, without requiring enlargement of a chip-size, provision of a large separate site, and usage of a transistor having a large leak current.

Figure 1B:
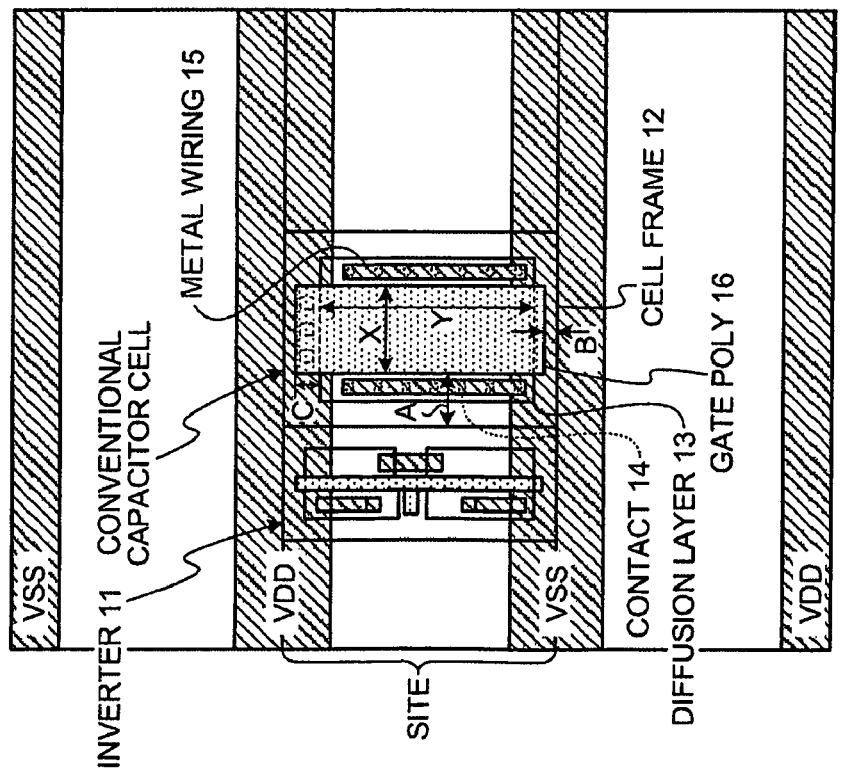
FIG. 1B is a schematic diagram of a capacitor-cell according to an embodiment of the present invention.

The above characteristics are explained specifically below. First, as illustrated in FIG. 1B, the capacitor-cell according to the example of the present embodiment is configured by disposing various functional parts in a planar quadrangular cell-frame 2. The cell-frame 2 is set on a site that is a region on a chip. The site is provided between the power line and the grounding line in a direction of the power line and grounding line. Specifically, as illustrated in FIG. 2B, the capacitor-cell according to the example of the present embodiment is configured by disposing a diffusion layer 3, a contact 4, a metal wiring 5, and a gate poly 6, in the cell-frame 2.

In a MOS transistor, the diffusion layer 3 is a portion through which an electric charge flows, and constitutes a source and a drain. MOS is a kind of switching element in which electric conductivity between a source diffusion layer and a drain diffusion layer changes. The electric conductivity (on or off) is controlled by voltage of a gate electrode. The diffusion layer, if of a p-type MOS, is a p-type semiconductor region that is made such that the gate electrode is interposed in an n-type semiconductor substrate. For an n-type MOS, an n-type semiconductor region that is made such that the gate electrode is interposed in a p-type semiconductor substrate is the diffusion layer.

The contact 4 is for connecting the various functional parts. For example, as illustrated in FIG. 2B, the contact 4, on one hand, connects the diffusion layer 3 with the gate poly 6 at a power line (VDD) end. As illustrated in FIG. 3, the contact 4, on the other hand, connects the diffusion layer 3 with the metal wiring 5 at a grounding line (VSS) end. The metal wiring 5 is a wiring manufactured by using a metal such as aluminum. The gate poly 6 is an electrode that is made of a wiring manufactured using polysilicon and the like. In FIG. 2B, an amount of protrusion of the gate poly 6 with respect to the diffusion layer 3 is defined as a design rule and a manufacturing rule. In other words, upon designing and manufacturing, a predetermined value defined by the design rule and manufacturing rule needs to be secured as the amount of protrusion of the gate poly 6 with respect to the diffusion layer 3.

As illustrated in FIG. 3, the capacitor-cell according to the example of the present embodiment is manufactured by placing the contact 4 on the diffusion layer 3 that is interposed between insulators 8, connecting the diffusion layer 3 with the metal wiring 5 via the contact 4, and disposing the gate poly 6 on an insulating layer 9 provided on the diffusion layer 3. Capacitance is generated in the insulating layer 9.

A conventional capacitor-cell is manufactured in a similar manner, and design rules explained below need to be satisfied to avoid short-circuit and contact of cells. Specifically, as illustrated in FIG. 2A, it is preferable to satisfy distances A, B, and C. The distance A is a lateral (X-direction) distance from a cell-frame 12 to a gate poly 16, for disposing a contact 14 that connects a diffusion layer 13 and a metal wiring 15. The distance B is a vertical (Y-direction) distance from the cell-frame 12 to the gate poly 16. The distance C is a vertical (Y-direction) distance for disposing the contact 14 that connects the diffusion layer 13 with the gate poly 16 at the power line (VDD) end.

In contrast, as illustrated in FIG. 2B, in the capacitor-cell according to the example of the present embodiment, the gate poly 6 for accumulating the capacitance is extended up to the positions of the power line and grounding line in the cell-frame 2. The gate poly 6 is not necessarily extended up to the positions of the power line and grounding line in the cell-frame 2. The gate poly 6 may be extended up to one of the positions of the power line and grounding line. Thus, in the capacitor-cell, an area (X times Y) overlapped by the gate poly 6 and the diffusion layer 3, which is mainly related to an amount of accumulated capacitance, is enlarged.

An example of capacity ratio between capacitance accumulated in a conventional capacitor-cell and capacitance of the capacitor-cell according to the example of the present embodiment is illustrated in FIG. 4. The capacity ratio between the capacitance accumulated in the conventional capacitor-cell and capacitance of the capacitor-cell according to the example of the present embodiment is "142%" if the gate poly 6 is extended up to the positions of the power line and grounding line, "119%" if the gate poly 6 is extended up to the position of the power line, and "127%" if the gate poly 6 is extended up to the position of the grounding line. Compared with the capacitance accumulated in the conventional capacitor-cell, the capacitance of the capacitor-cell according to the example of the present embodiment is larger.

Further, the gate poly 6 in the capacitor-cell according to the example of the present embodiment is provided with a margin 7 by enlarging the gate poly 6 up to outside the position of the grounding line of the cell-frame 2. The margin 7 is the amount of protrusion of the gate poly 6 with respect to the diffusion layer 3, and is provided based on a manufacturing rule for absorbing a manufacturing error. By providing the margin 7 outside the cell-frame 2, as illustrated in FIG. 5 for example, when the diffusion layer 3 is placed over the cell-frame 2 and a plurality of these are connected in a vertical direction (Y-direction), the diffusion layers 3 and the gate polys 6 are connected.

Therefore, in the capacitor-cell according to the example of the present embodiment, the gate poly 6 for accumulating capacitance is extended up to the positions of the power line and grounding line or up to the position of the power line or grounding line in the planar quadrangular cell-frame 2 set for disposing a cell on one or more sites that is/are a region on a chip provided between the power line and the grounding line in a direction of the power line and grounding line. As a result, without requiring the enlargement of the chip-size, provision of the large separate site, and usage of the transistor having a large leak current, it is possible to increase the per-unit-area capacity of the capacitor-cell and secure the large decoupling capacity.

Further, the capacitor-cell according to the example of the present embodiment further includes a diffusion region that is a semiconductor region formed such that the gate poly 6 is interposed in a semiconductor substrate, and the gate poly 6 is extended up to the outside of the position of the grounding line of the cell frame 2, i.e., up to outside the diffusion layer 3 that contacts the cell-frame 2. Thus even if only one capacitor-cell is disposed, the margin 7 of a predetermined amount that is the amount of protrusion of the gate poly 6 with respect to the diffusion layer 3 is secured. Accordingly, it is possible to satisfy the manufacturing rule for absorbing the error in manufacturing the gate poly 6.

Further, in the capacitor-cell according to the example of the present embodiment, because a plurality of gate polys 6 are coupled in a vertical direction, it is possible to effectively utilize a free space extending over a plurality of sites to increase the per-unit-area capacity of the capacitor-cell.

Further, an integrated circuit utilizing the capacitor-cell according to the example of the present embodiment may be manufactured. By applying the capacitor-cell according to the example of the present embodiment to an integrated circuit including a plurality of sites, without requiring the enlargement of the chip-size, provision of the large separate site, and usage of the transistor having a large leak current, it is possible to increase the per-unit-area capacity of the capacitor-cell and obtain the integrated circuit securing a large decoupling capacity.

Further, manufacturing steps of an integrated circuit may be assembled to apply the capacitor-cell according to the example of the present embodiment. Specifically, a manufacturing method of an integrated circuit including a plurality of sites includes a step of disposing the capacitor-cell of which the gate poly for accumulating capacitance is extended up to the positions of the power line and grounding line, or up to the position of the power line or grounding line in the planar quadrangular cell-frame that is set on the plurality of sites for disposing cells. As a result, it is possible to increase the per-unit-area capacitance of the capacitor-cell and obtain the manufacturing method of an integrated circuit securing the large decoupling capacity without the necessity of the enlargement of the chip-size, provision of the large separate site, and usage of the transistor having a large leak current.

Designing steps of an integrated circuit may be assembled applying the capacitor-cell according to the example of the present embodiment. Specifically, the integrated circuit is designed to dispose the capacitor-cell of which the gate poly for accumulating capacitance is extended up to the positions of the power line and grounding line, or up to the position of the power line or grounding line in the planar quadrangular cell-frame that is set on the plurality of sites for disposing cells. As a result, it is possible to increase the per-unit-area capacity of the capacitor-cell and design an integrated circuit securing the large decoupling capacity without the necessity of the enlargement of the chip-size, provision of the large separate site, and usage of the transistor having a large leak current, in each capacitor-cell disposed in the integrated circuit.

In the above, the capacitor cell according to the example of the present embodiment is explained as being disposed in the remaining region on the sites where the plurality of cells have been disposed. The present invention is not limited to this example. An exclusive region for disposing the capacitor-cell may be provided on a site, and the capacitor-cell may be disposed on the exclusive region. The capacitor-cell may be disposed considering a layout at the time of designing by looking at a balance between other cells and a required capacity of the capacitor-cell.

Further, the capacitor-cell according to the example of the present embodiment may include a transistor having a large leak current to obtain an even larger capacity.

Further, the capacitor-cell according to the example of the present embodiment may be configured with the power line (VDD) and the grounding line (VSS) interchanged. That is, the gate poly 6 may be connected to the grounding line (VSS), and the diffusion layer 3 may be connected to the power line (VDD).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A capacitor-cell in an integrated circuit that is configured by disposing a plurality of cells on a site that is on a chip and that is provided between a power line and a grounding line in a direction of the power line and grounding line, wherein
    the capacitor cell is disposed in a remaining region on the site, after the plurality of cells are disposed on the site, the capacitor-cell comprises
    a gate poly for accumulating capacitance extending up to a planar quadrangular cell-frame that is set for disposing the plurality of cells on the site and that is disposed on at least one of the power line and the grounding line; and
    a diffusion region extending up to the position of the grounding line and connected to other diffusion region in a vertical direction perpendicular to the direction of the power line and grounding line, and
    the gate poly includes a margin extending further from the position of the grounding line of the cell-frame by a predetermined length and overlapping the other diffusion region layer being adjacent to the diffusion region.

2. The capacitor-cell according to claim 1, further comprising:
    at least another one of the capacitor-cell coupled to the capacitor-cell in a vertical direction perpendicular to the direction of the power line and grounding line.

3. An integrated circuit comprising:
    a capacitor-cell disposed in a remaining region on a site that is on a chip and that is provided between a power line and a grounding line in a direction of the power line and grounding line after a plurality of cells are disposed on the site, the capacitor-cell including a gate poly for accumulating capacitance extending up to a planar quadrangular cell-frame that is set for disposing the plurality of cells on the site and that is disposed on at least one of the power line and the grounding line; and a diffusion region extending up to the position of the grounding line and connected to other diffusion region in a vertical direction perpendicular to the direction of the power line and grounding line, and
    the gate poly includes a margin extending further from the position of the grounding line of the cell-frame by a predetermined length and overlapping the other diffusion region layer being adjacent to the diffusion region.

4. A method of manufacturing an integrated circuit, comprising:
    disposing a plurality of cells formed per processing function on a site that is a region on a chip and that is provided between a power line and a grounding line in a direction of the power line and grounding line;
    disposing, in each remaining region on the site, a capacitor cell including a gate poly for accumulating capacitance extending up to a planar quadrangular cell-frame that is set for disposing the plurality of cells on the site and that is disposed on at least one of the power line and the grounding line; and a diffusion region extending up to the position of the grounding line and connected to other diffusion region in a vertical direction perpendicular to the direction of the power line and grounding line, and
    the gate poly includes a margin extending further from the position of the grounding line of the cell-frame by a predetermined length and overlapping the other diffusion region layer being adjacent to the diffusion region.

5. A method of designing an integrated circuit configured by disposing a capacitor cell in each remaining region on a site that is a region on a chip and that is provided between a power line and a grounding line in a direction of the power line and grounding line, after a plurality of cells formed per processing function are disposed on the site, the method comprising:

designing to include in the capacitor cell a gate poly for accumulating capacitance extending up to a planar quadrangular cell-frame that is set for disposing the plurality of cells on the site and that is disposed on at least one of the power line and the grounding line; and a diffusion region extending up to the position of the grounding line and connected to other diffusion region in a vertical direction perpendicular to the direction of the power line and grounding line, using a microprocessor, and the gate poly includes a margin extending further from the position of the grounding line of the cell-frame by a predetermined length and overlapping the other diffusion region layer being adjacent to the diffusion region.

* * * * *